United States Patent
Tasaki et al.

[11] Patent Number: 5,904,771
[45] Date of Patent: May 18, 1999

[54] METHOD OF SUBLIMING MATERIAL IN CVD FILM PREPARATION METHOD

[75] Inventors: Yuzo Tasaki; Mamoru Sato; Shuji Yoshizawa, all of Tokyo, Japan; Atsushi Onoe; Kiyofumi Chikuma, both of Saitama, Japan; Ayako Yoshida, Saitama, Japan

[73] Assignees: Dowa Mining Co., Ltd.; Pioneer Electric Corporation, both of Japan

[21] Appl. No.: 08/826,626

[22] Filed: Apr. 3, 1997

[30] Foreign Application Priority Data

Apr. 5, 1996 [JP] Japan .................................. 8-108745
Mar. 7, 1997 [JP] Japan .................................. 9-068964

[51] Int. Cl.$^6$ .................................................. C30B 25/12
[52] U.S. Cl. ............................ 117/105; 117/109; 117/948
[58] Field of Search .................................... 117/105, 109, 117/948

[56] References Cited

U.S. PATENT DOCUMENTS

| | | | |
|---|---|---|---|
| 3,472,685 | 10/1969 | Marfaing | 117/109 |
| 3,514,320 | 5/1970 | Vaughan | 117/105 |
| 3,591,348 | 7/1971 | Belle | 117/948 |
| 5,645,638 | 7/1997 | Kumagai | 117/105 |

OTHER PUBLICATIONS

Chemical Separations and Measurements Dennis Peters/John Hayes/Gary Hieftje p. 480, 1974.

*Primary Examiner*—Robert Kunemund
*Attorney, Agent, or Firm*—Patterson, Belknap, Webb, & Tyler LLP

[57] ABSTRACT

A method of subliming material is provided for use in a CVD film preparation method wherein a CVD precursor is sublimed from its solid state by heating to a temperature not exceeding its melting point, thereby producing a vapor of the precursor, and the vapor of the precursor is transported to a reactor. The method of subliming material comprises the steps of forming the solid-state compound into a film, covering a back surface of the film with a non-reactive support and exposing a front surface of the film to an atmosphere as a sublimation surface. The method maintains the exposed surface area of the solid compound constant during processing.

8 Claims, 6 Drawing Sheets

METHOD OF SUBLIMING MATERIAL IN CVD FILM PREPARATION METHOD

BACKGROUND OF THE INVENTION

This invention relates to a method of preparing thin film by CVD (chemical vapor deposition), particularly to a method of subliming a solid material to form a substrate with a thin film including a component useful in a ferroelectric material, an electrode material, an LSI (large-scale integrated circuit) wiring material, an optical element, a superconducting material or the like, more particularly to a method of subliming a material which enables formation of a uniform film without variation in film growth rate or film composition over time.

Methods of preparing single crystal film and polycrystalline film fall in two categories: the dry process and the wet process. The dry processes has been widely adopted because the quality of the film grown by this process is generally better than that produced by the wet process.

Dry process methods include physical film forming methods such as vacuum deposition and ion plating, and chemical film forming methods such as chemical vapor deposition (CVD). Among these, CVD has been widely adopted because it enables the film growth rate to be controlled with ease, does not require the film growth to be conducted under a high vacuum, is capable of high-speed film growth and is otherwise suitable for volume production.

CVD uses a metal complex as precursor. Thermochemical vapor deposition, photochemical vapor deposition, plasma CVD and the like are adopted to decompose the precursor vapor during growth of a metal thin film. The complex compound precursor is generally a metal organic β-diketonate complex whose ligand is dipivaloylmethane, hexafluoroacetylacetone or the like.

When a conventional metal organic β-diketonate complex is used in CVD, the high melting point of the complex requires it to be vaporized by sublimation from solid state. Since the volume of the solid material in the precursor vessel therefore varies as the sublimation proceeds, the vaporization rate varies.

Since the amount of vaporized material therefore generally decreases with passage of time, it is difficult to secure a constant film growth rate over long periods. When it is attempted to grow a compound thin film including two or more metal elements, moreover, the film composition is difficult to control owing to the change in amount of vapor with passage of time.

While these problems could be overcome by using a material with a low melting point and vaporizing it from liquid state, few metal precursor meet this description. Ordinary precursor therefore have to be sublimed from solid state.

JP-A-4-333572 teaches a method of bringing a carrier gas into contact with a porous body whose surface and/or interior is charged with a metal organic complex as the precursor. This publication claims that this method increases the evaporation rate and enables a large amount of the metal organic complex to be stably transported to the film growth site. In fact, however, when the precursor is retained in a porous body, the area of the exposed precursor remains constant only for a short period at the start, and then, as the evaporation proceeds, unavoidably begins to vary owing to progressive exposure of the precursor retained in the countless pores at the surface of the porous body. The evaporation rate therefore varies.

The object of this invention is therefore to provide a method which suppresses time-course variation of evaporation rate during sublimation of a solid-state precursor to enable growth of film by CVD under a stable evaporation rate.

The above and other objects and features of the present invention will become apparent from the following description made with reference to the drawings.

SUMMARY OF THE INVENTION

For achieving this object, the present provides a method of subliming material in a CVD film preparation method wherein a CVD precursor is sublimed from its solid state by heating to a temperature not exceeding its melting point, thereby producing a vapor of the precursor, and the vapor of the precursor is transported to a reactor, the method comprising the steps of forming the solid-state compound into a film, covering a back surface of the film with a non-reactive support and exposing a front surface of the film to an atmosphere as a sublimation surface.

DESCRIPTION OF THE PREFERRED EMBODIMENTS

The method of this invention will now be described in detail in the following, with reference to the accompanying drawings showing preferred embodiments of the invention.

The characterizing feature of this invention is that the CVD precursor to be sublimed from its solid state is prepared into a thin film, one side surface of the film is masked with and attached to a non-reactive support and the other side surface is exposed to a sublimation atmosphere, whereby progressive sublimation of the precursor of the thin film only reduces the thickness of the film throughout and does not cause a change in the exposed surface area with passage of time. When a precursor is sublimed as it is in the form of powder or agglomerated particles in the conventional manner, the area thereof varies as the sublimation progresses and/or the gassified compound recondenses. Since this varies the concentration of the precursor gas, it degrades the production efficiency of the desired film and produces variation in the film growth rate and, in turn, variation in film composition. The method of this invention eliminates these problems.

When the solid precursor is formed into a film of constant thickness and both surfaces of the film are exposed to the sublimation atmosphere, the surface area of the film varies owing to changes in its shape caused by progressive local recondensation and recrystallization. This makes it impossible to maintain the compound gas concentration constant. When one surface of the film is fixed in contact with a non-reactive support, however, the shape of the film stabilizes and the solid precursor can be sublimed from the exposed surface substantially uniformly. The uniform gas concentration can therefore be maintained until almost all of the precursor has been sublimed.

The support to which the other (back) surface of the film is fixed can be made of glass, ceramic, a metal such as stainless steel or any of various other non-reactive materials. The surface of the support has to be made as smooth as possible. Use of a porous material such as taught by JP-A-4-3335722 should be avoided because entry of the precursor into the pores causes the exposed surface area of the precursor to vary as sublimation of the compound progresses.

The non-reactive support must not react with the precursor. It preferably has a smooth surface and a shape capable of retaining the film of solid precursor during the reaction. Even a support with a smooth surface can adequately retain the film layer up to completion of the reaction if it is suitably configured. The best shape is spherical, in which case the film layer is adhered to small spherical bodies measuring around 1–10 mm in diameter. The spheres can be increased in outermost surface area by forming their surfaces with smooth irregularities. By coating such a sphere with a film of constant thickness so as to follow the irregularities, a further increase in the exposed surface area of the film layer can be realized. When a large number of such film-coated spheres are charged into a column and a carrier gas is passed through the column, the gaps between the spheres provide a good path for gas passage, thereby enabling higher sublimation efficiency.

When the method of this invention is effected, the bonding strength can be enhanced by use of a sealing substance such as silica gel or zeolite. Although such a substance includes fine pores, the amount of the precursor permeating the fine pores is very small compared with the amount of the film layer formed so that the effect of the invention is still adequately manifested.

Rod-, pipe- or plate-shaped supports can be used instead of a spherical ones. Rod-shaped supports are each surface-coated with a layer of precursor film and then charged into the carrier gas passage in the precursor vessel as assembled in the manner of the logs of a raft, thereby providing an excellent path for gas passage. Pipe-shaped supports are each coated on the outer and inner surfaces with layers of precursor film and a large number of the pipe-shaped supports are arranged with their axes parallel to the carrier gas flow direction, thereby providing an excellent path for gas passage. Plate-shaped supports are each coated on one or both major surfaces with a layer or layers of precursor film and a large number of the plate-shaped supports disposed in the carrier gas passage as spaced from each other. Plate-shaped supports can formed of stainless steel plates, for instance.

Supports of various other configurations are also usable insofar as when placed in the gas flow passage they allow passage of gas with little resistance and provide a sufficiently large contact area. Supports meeting these requirements include, for example, corrugated or embossed materials, irregularly shaped particles such as natural sand, and regularly shaped particles such as of egg- or mica-like shape. By appropriately combining such supports in different shapes and sizes, the sublimation area of the film layers can be increased even further.

Specially shaped supports include blocks formed as circular or square columns and formed with numerous parallel through-holes in the axial direction. The inner walls of the through-holes are coated with layers of precursor film and the carrier gas is passed through the holes. Use of coarse net, fiber, porous particles and the like should be avoided, however, since such materials do not permit formation of film layers of uniform thickness.

Although the type of the precursor used to coat the supports can be of any type insofar as it can be vaporized from solid state, the precursor most often used in the method of this invention are the metal organic β-diketonate complexes widely used as the precursor for growing film by CVD. Such a metal organic complex can be coated on the support surfaces in the form of film by any of various methods including the method of melting the metal complex by heating, applying the molten metal complex to the supports and then cooling it and the method of dissolving the metal complex in a solvent, applying the solution to the surface of the supports and then removing the solvent under reduced pressure.

Figure 1:
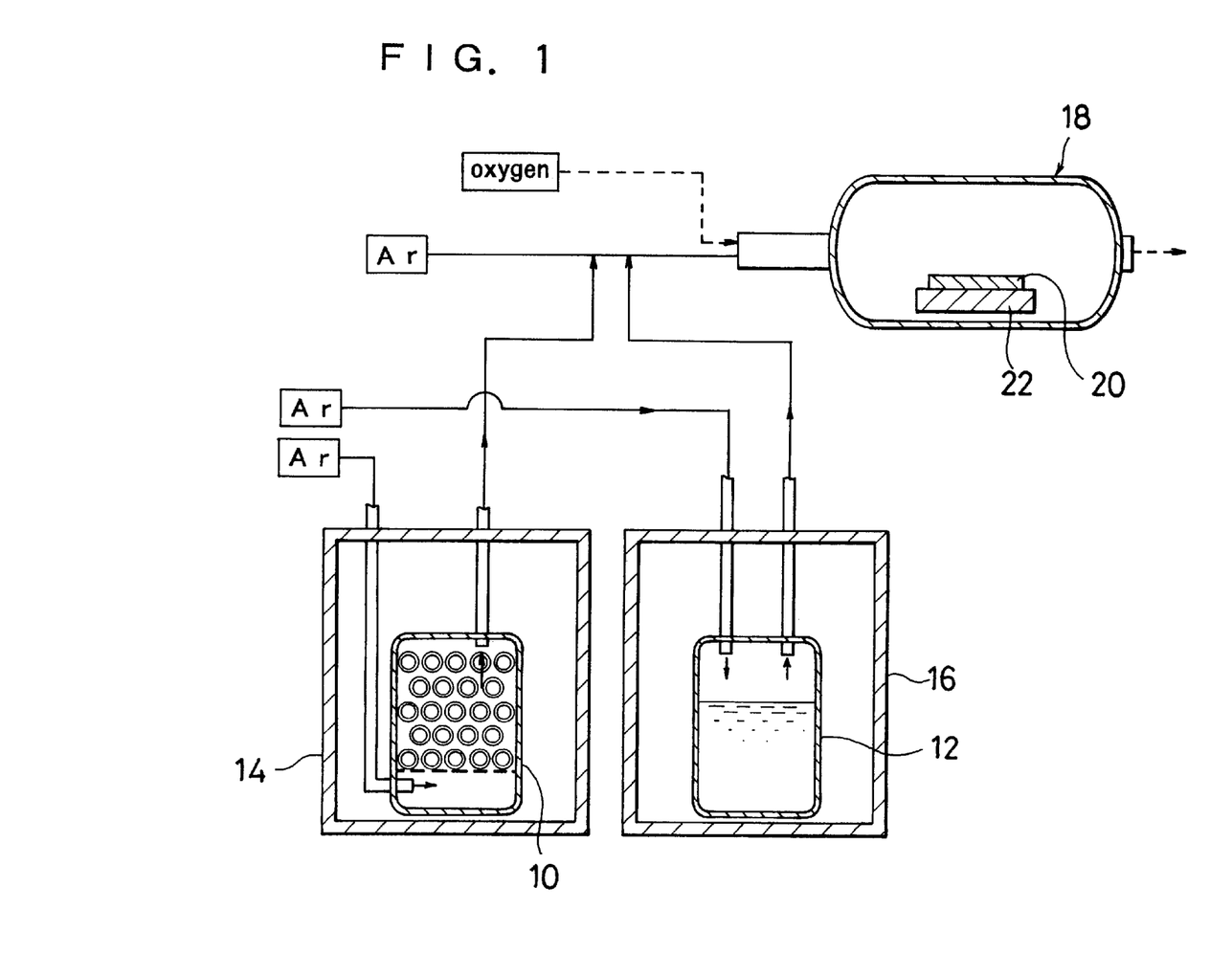
FIG. 1 is a diagram showing an example of the layout of equipment for implementing the CVD method of this invention.

Examples of the invention will now be explained, in which the CVD apparatus shown in FIG. 1 is used to form a film of $KNbO_3$ (potassium niobate), a photochemical material, using K(DPM) as the material for K supply. (DPM stands for dipivaloylmethane.)

EXAMPLE 1

Starting materials for supplying K and Nb are required for growing $KNbO_3$ film. K(DPM), a metal organic β-diketonate complex, was used to supply K and $Nb(OC_2H_5)_5$ (pentaethoxyniobium) was used to supply Nb. Since K(DPM) has a high melting point, it was vaporized from solid state. The Nb compound, which has a low melting point, was vaporized from liquid state.

The K(DPM) to be evaporated from solid state was substantially uniformly applied as film layer of a thickness of about 0.5 mm and a total weight of 10 g onto the entire smooth surfaces of 10-mm-diameter glass spheres. The coating treatment was effected by immersing the glass spheres in a bath of molten K(DPM). The K(DPM)-coated spheres obtained were placed in the precursor vessel 10 of FIG. 1. The Nb compound was placed in the precursor vessel 12 in unmodified form. As shown in FIG. 1, the precursor vessels 10 and 12 were placed in separate ovens 14 and 16. The oven 14 was controlled to a temperature of about 180° C. and the oven 16 to a temperature of about 110° C. as Ar carrier gas was passed therethrough to produce mixed gases of precursor gas and carrier gas. The mixed gases were passed into a reactor 18 while being added with oxygen gas to grow a $KNbO_3$ film on a substrate 20 in the reactor 18.

The substrate 20 was placed on a susceptor 22 and the susceptor 22 was heated by high-frequency radiation to maintain the substrate temperature at 650° C. Ribbon heaters were attached to the piping for passage of carrier gas from the precursor vessels 10 and 12 to the reactor 18 and used to maintain the temperature inside the piping at or above the oven temperatures. The reactor 18 was connected to an exhaust unit and forced evacuation was effected to depressurize the reactor 18 so as to maintain the flow rate of the Ar carrier gas constant during the processing at 500 SCCM with respect to K(DPM) and at 25 SCCM with respect to Nb(OC$_2$H$_5$)$_5$.

For comparison, a film of KNbO3 was grown on a substrate 20 by the same procedures as in the foregoing Example except that the K(DPM) placed in the precursor vessel 10 was 10 g of powder K(DPM) sandwiched between upper and lower meshes.

Figure 2:
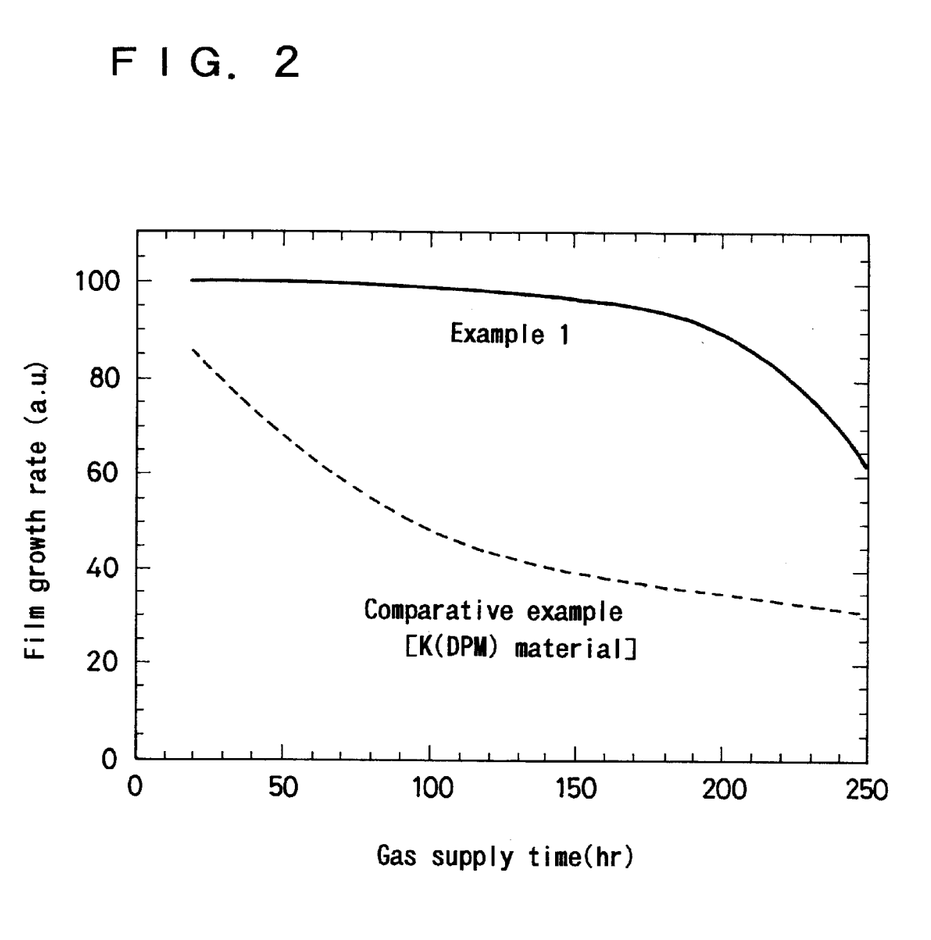
FIG. 2 is a graph comparing the film growth rates of the invention and a comparative example.

FIG. 2 shows the measured film growth rates (time-course changes) in Example 1 and the comparative example. As can be seen, the film growth rate declined with passage of time in the case of evaporating powder K(DPM), whereas in the case of evaporating K(DPM) in the form of a film layer exposed only on one side in accordance with this invention, a high film growth rate exceeding the initial maximum film growth rate in the comparative example was constantly maintained over a very long period up to the time the film layer had been used up.

In each case, the precursor vessel was opened to examine the interior after the film growth rate had declined. In the case of Example 1, the surfaces of the glass spheres were observed to be partially exposed. In the case of the comparative example, the precursor powder had changed to coarse grains that stuck together in a lump.

These results can be considered to show that in the Example according to the invention the sublimation progressed and the supply of precursor was conducted with the solid surface area of the K(DPM) maintained constant at its initial magnitude, and owing to this, plus the fact that the carrier gas passage was constantly defined by the shape of the spheres, little variation arose in the film growth rate. In contrast, it is presumed that in the comparative example the powder K(DPM) used as the precursor progressively changed to coarse grains with the passage of time owing to recrystallization of precursor sublimed from the powder and coalescence among the powder particles, so that the overall surface area decreased to reduce the contact area with the carrier gas and lower the film growth rate. Moreover, while the initial solid surface area is believed to have been greater in the Example than in the comparative example, the initial film growth rate in the Example was equal to or higher than that in the comparative example. The reason for this is believed to be that since the charged volume was much greater in the Example than in the comparative example owing to the volume of the glass spheres, in effect there was secured a carrier gas contact surface area on a par with that of the powder precursor.

EXAMPLE 2

Figure 3:
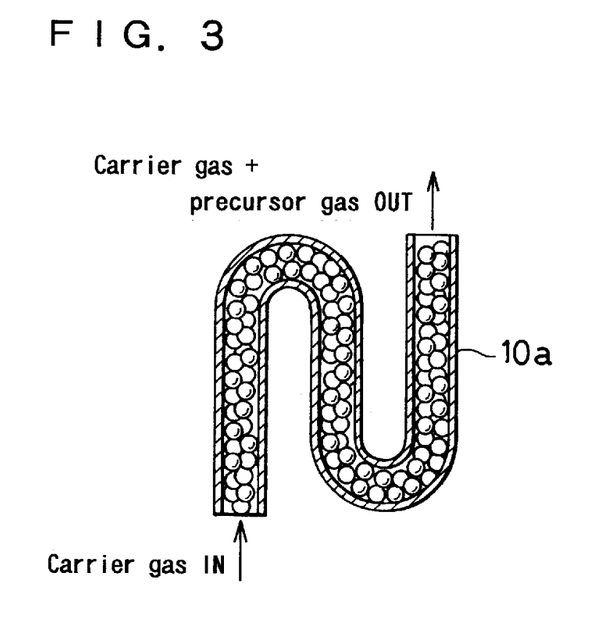
FIG. 3 is simplified sectional view showing an example of implementation of the invention using a long column.

A film of KNbO3 was grown in the same manner as in Example 1, except that the gooseneck-shaped long column 10*a* shown in FIG. 3 (40 mm in inner diameter by 1,000 mm in overall length) was used as the precursor vessel. The interior of this column was charged over its full length with K(DPM)-coated spheres of the same type as used in FIG. 1.

Figure 4:
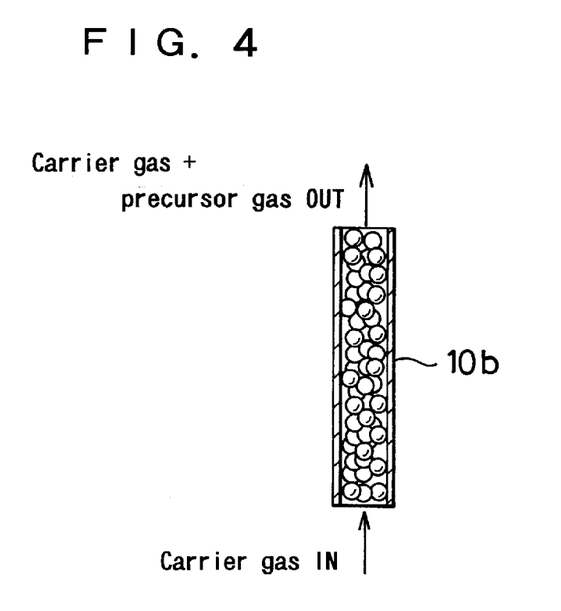
FIG. 4 is simplified sectional view showing an example of implementation of the invention using a short column.

Similarly, a film of KNbO3 was grown in the same manner as in Example 1, except that the short column 11*b* shown in FIG. 4 (40 mm in inner diameter by 300 mm in overall length) was used as the precursor vessel. As in the case of the long column, the short column was also charged with K(DPM)-coated spheres.

Figure 5:
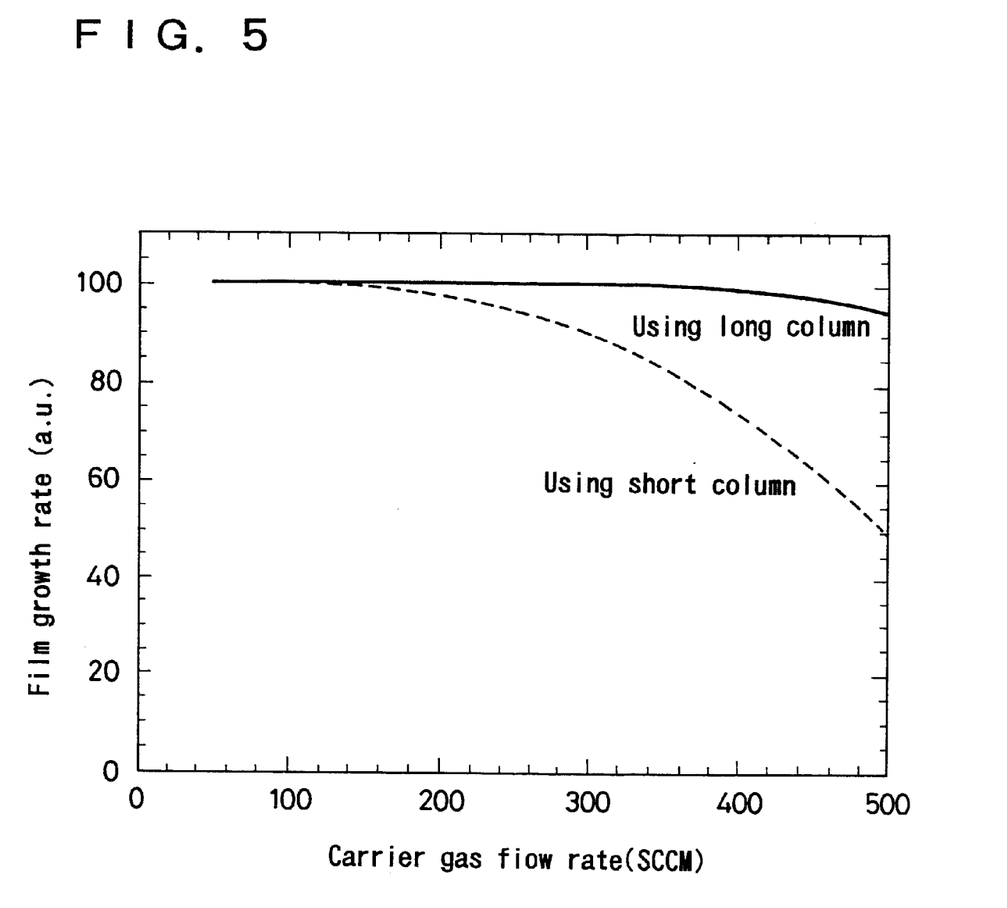
FIG. 5 is a graph showing how film growth rate varies as a function of carrier gas flow rate in the cases of using a long column and a short column.

FIG. 5 shows the measured film growth rates when the flow rate of the carrier gas through the two columns was varied. As can be seen, in the case of the short column, the film growth rate decreased when the carrier gas flow rate became large, while in the case of the long column, a high film growth rate was maintained even when the carrier gas flow rate became large. From this it will be understood that high-concentration precursor gas can be obtained at a higher flow rate by increasing the column length. This indicates that, for one and the same charged volume, the value of [contact area between carrier gas and K(DPM)] x [time] increases with increasing column length. It will be noted that a certain range of flow rates exists within which the film growth rate stays substantially constant. This indicates that within this region the precursor is included in the carrier gas at saturated vapor pressure. A long column is preferably bent so that it can be accommodated in an oven in the same way as a short column.

EXAMPLE 3

Figure 6:
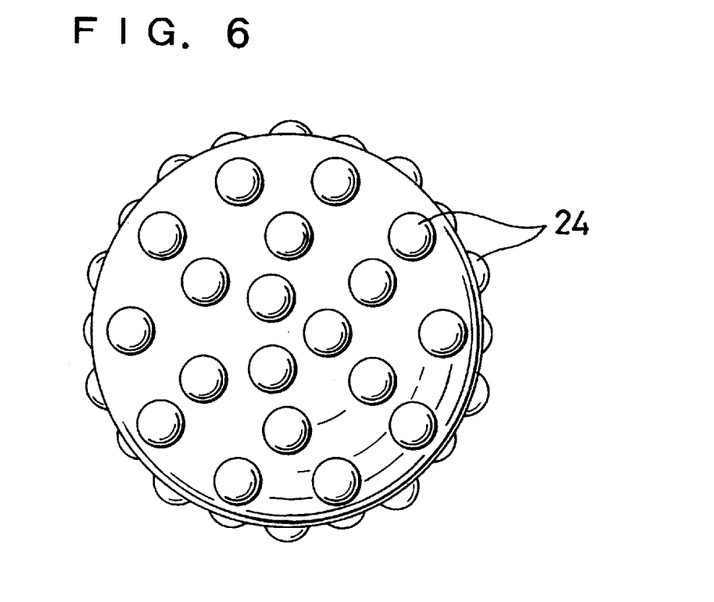
FIG. 6 is a front view showing an example of a spherical body provided with smooth surface irregularities.

The glass spheres used in this Example were of approximately the same diameter as those used in Example 1 but, as shown in FIG. 6, were increased in surface area by forming the surfaces thereof with a large number of smooth, hemispherical protuberances 24. These smooth-surfaced spheres formed with protuberances were coated with K(DPM) film layers of substantially even thickness to a weight of 10 g and were then used to grow a film of KNbO3 in the same manner as in Example 1. As in Example 2, the film growth rate was examined under varied carrier gas flow rate. When the measured film growth rate was compared with that in the case of using true spheres in Example 1, it was found that a high film growth rate even at large flow rate was better maintained by use of spheres with protuberances than by use of spheres without protuberances. This can be attributed to the fact that an increased area of contact with the carrier gas is obtained owing to the greater K(DPM) surface area even at the same charging volume.

EXAMPLE 4

Figure 7:
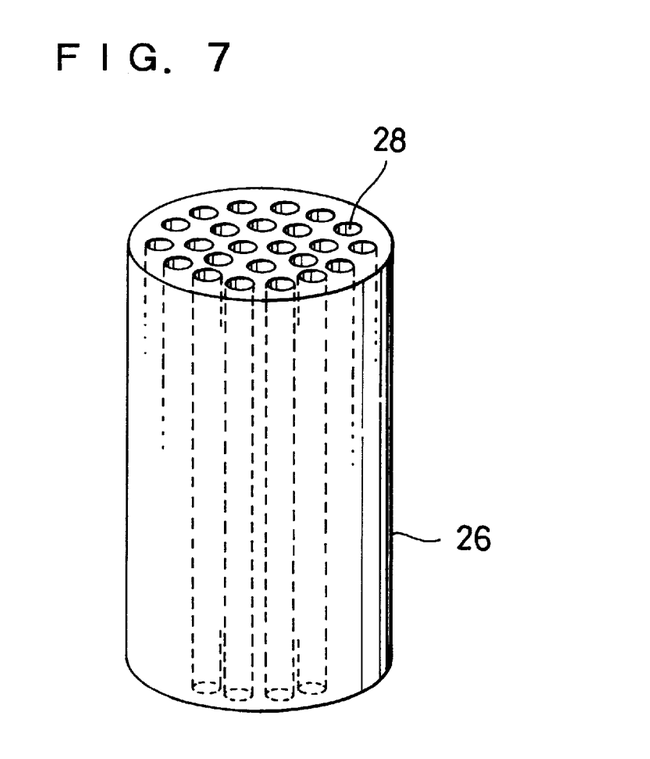
FIG. 7 is a perspective view showing an example of a support provided with many fine through-holes.

As shown in FIG. 7, a ceramic cylindrical block 26 (50 mm in outer diameter by 300 mm in height) was formed vertically with a large number of through-holes 28 measuring about 5 mm in diameter and having smooth surfaces. The inner surfaces of the through-holes 28 were coated with K(DPM) film layers of substantially even thickness to a weight of 10 g. The result was placed in the vessel 1. A film of KNbO$_3$ was grown in the same manner as in Example 1 in all other aspects than the above. The film growth rate tended to follow the same pattern as that of Example 1 shown in FIG. 2.

EXAMPLE 5

Figure 8:
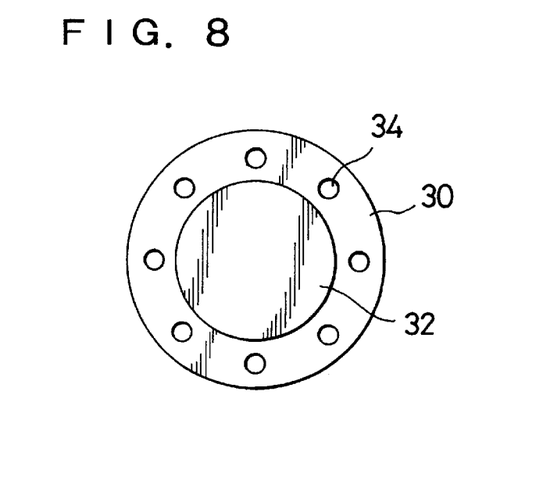
FIG. 8 is a plan view showing a support consisting of a stainless steel disk formed with through-holes and having its center surface portion coated with a film of precursor.
Figure 9:
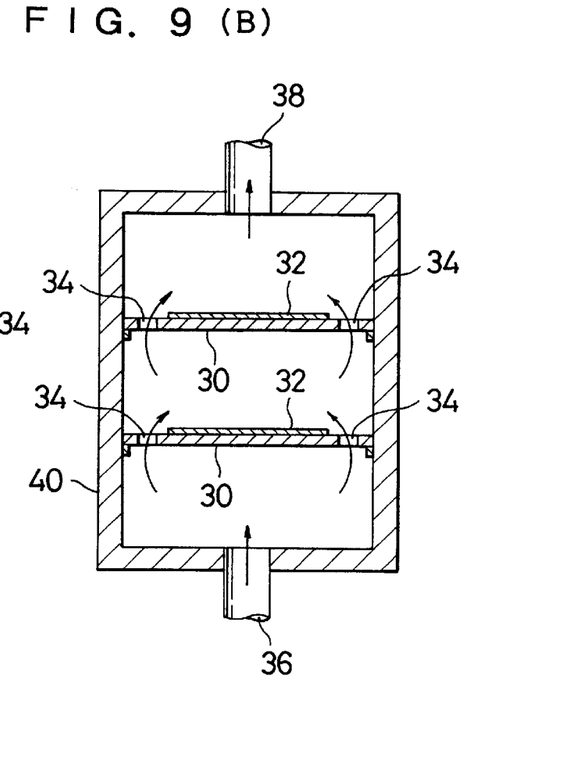
FIG. 9(A) and 9(B) are sectional views of vessels respectively installed with the support shown in FIG. 8 in one tier and two tiers.
Figure 9A:
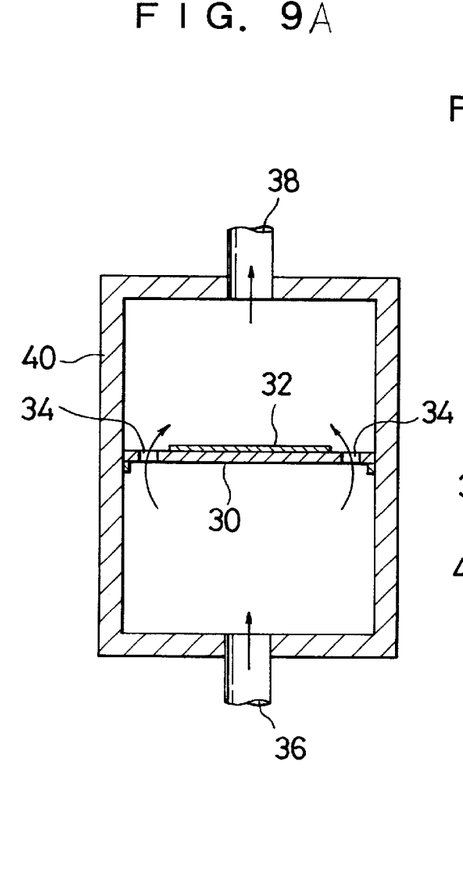

As shown in the plan view of FIG. 8, 10 g of a K(DPM) film layer 32 of substantially even thickness was coated on the center surface portion on one side of a disk 30 of US304 stainless steel (delustered stainless steel sheet) measuring 80 mm in outer diameter and 2 mm in thickness. Numerous holes 34 were formed concentrically at regular intervals near the periphery of the stainless steel disk 30. As shown in FIG. 9(A), the support fabricated in this manner was installed in a single tier in a cylindrical vessel 40 having an interior diameter of about 80 mm and formed with a lower carrier gas inlet 36 and an upper gas outlet 38. The support was installed to lie perpendicular to the vessel axis and so as to position the surface of the film layer 32 on the downstream side relative to the gas flow. A film of KNbO$_3$ was grown in the same manner as in Example 1, except the vessel 40 was used in place of the precursor vessel 10. The film growth rate tended to follow the same pattern as that of Example 1 shown in FIG. 2. The same method was then repeated in the same manner except that, as shown in FIG. 9(B), stainless steel disks 30 similarly coated with film layers 32 were installed in two tiers. From the results it was confirmed that this arrangement enabled stable maintenance of a high film growth rate.

Although the foregoing embodiments relate to the preparation of KNbO3 (potassium niobate) film, the invention can also be applied with similar results to various other precursor of the so-called solid precursor type. Specifically, for example, similar results can be obtained in the case of using such known solid precursor for growing superconducting films as $Sr(DPM)_2$, $Ba(DPM)_2$ and the like.

As explained in the foregoing, this invention enables precursor for CVD to be sublimed from solid state without variation in the solid surface area during the processing, while also enabling contact with the carrier gas to be maintained constant. As a result, the film growth rate can be maintained constant and a high film growth rate can be achieved. The invention therefore ensures preparation of high quality film with good productivity. In an operation for growth of film comprising two or more elements, moreover, this invention makes a marked contribution to improving the performance of various thin-film materials through its capability to strictly control the component ratios.

The method of subliming material in CVD film preparation according to present invention has thus been shown and described with reference to preferred embodiments based on the attached drawings. However, it should be noted that the present invention is in no way limited to the details of the described arrangements and an expert in the field will be able to make various changes and modifications without departing from the technical concept set out the appended claims. Such changes and modifications also of course fall with the technical scope of the invention.

The entire disclosure of Japanese Patent Application No. JP 8-108745 filed on Apr. 5, 1997 and Japanese Patent Application No. JP9-68964 filed on Mar. 7, 1997, including the specification, claims, drawings and summary, is incorporated herein by reference in its entirety.

We claim:

1. A method of subliming material in a CVD film preparation method wherein a CVD precursor is sublimed from its solid state by heating to a temperature not exceeding its melting point, thereby producing a vapor of the precursor, and the vapor of the precursor is transported to a reactor, the method comprising the steps of:

forming the solid-state compound to be sublimed into a film;

covering a back surface of the film to be sublimed with a non-reactive support and exposing a front surface of the film as a sublimation surface;

placing the film whose back surface is covered in a vessel through which a carrier gas is passed;

passing the carrier gas through the vessel to sublime the film-form compound.

2. A method according to claim 1, wherein the non-reactive support is at least one sphere having a smooth surface.

3. A method according to claim 2, wherein the surface of the sphere is formed with smooth irregularities.

4. A method according to claim 3, wherein the at least one sphere is charged into a long column through which a carrier gas is passed.

5. A method according to claim 2 wherein the at least one sphere is charged into a long column through which a carrier gas is passed.

6. A method according to claim 1, wherein the non-reactive support is at least one rod or pipe having a smooth surface.

7. A method according to claim 1, wherein the non-reactive support is at least one metal plate.

8. A method according to claim 1, wherein the vessel is a long column.

* * * * *